(12) United States Patent
Dagel et al.

(10) Patent No.: US 12,424,346 B1
(45) Date of Patent: Sep. 23, 2025

(54) SPECKLE-BASED IMAGING DIFFUSER AND METHOD FOR CONTROLLABLY FABRICATING SAME

(71) Applicant: National Technology & Engineering Solutions of Sandia, LLC, Albuquerque, NM (US)

(72) Inventors: Amber Lynn Dagel, Lafayette, CO (US); Andrew Eugene Hollowell, Albuquerque, NM (US); Patrick Sean Finnegan, Albuquerque, NM (US); Kyle R. Thompson, Albuquerque, NM (US); Roger Derek West, Albuquerque, NM (US); Johnathan Mulcahy-Stanislawczyk, Albuquerque, NM (US); Ryan Nicolas Goodner, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 387 days.

(21) Appl. No.: 18/124,092

(22) Filed: Mar. 21, 2023

Related U.S. Application Data

(60) Provisional application No. 63/322,865, filed on Mar. 23, 2022.

(51) Int. Cl.
*G03F 1/22* (2012.01)
*G21K 1/06* (2006.01)

(52) U.S. Cl.
CPC .............. *G21K 1/062* (2013.01); *G03F 1/22* (2013.01); *G21K 1/065* (2013.01);
(Continued)

(58) Field of Classification Search
CPC ... G01N 23/041; G01N 2223/317; G03F 1/22
See application file for complete search history.

(56) References Cited

U.S. PATENT DOCUMENTS

| | | | |
|---|---|---|---|
| 2014/0252240 A1* | 9/2014 | Baker | G01N 23/00 250/390.12 |
| 2017/0025247 A1* | 1/2017 | Stevens | H01J 37/28 |

(Continued)

OTHER PUBLICATIONS

Berujon, S. et al., "Near-field speckle-scanning-based x-ray imaging," Physical Review A (2015) 92:013837, 8 pages.
(Continued)

*Primary Examiner* — David P Porta
*Assistant Examiner* — Mamadou Faye
(74) *Attorney, Agent, or Firm* — Mark A. Dodd

(57) ABSTRACT

A mask for use in a speckle-based x-ray or neutron phase contrast imaging system and methods of making the mask are disclosed. The mask may either absorb or change the phase of the incident x-ray or neutron beam. The mask in various embodiments has consistent statistics across the mask, is locally unique (thereby avoiding ambiguous correlations), has a speckle size on the order of the imaging system's resolution, has a speckle pattern that is visible through the sample being imaged, and/or is matched to the energy level of the imaging system and the sample density. These mask attributes are controlled by the method and materials used in the fabrication of the mask. Various embodiments use a pseudo-random binary array for generating the required speckle pattern.

19 Claims, 9 Drawing Sheets

(52) U.S. Cl.
CPC .. *G21K 2201/061* (2013.01); *G21K 2201/067* (2013.01); *G21K 2201/068* (2013.01); *G21K 2207/005* (2013.01)

(56) References Cited

U.S. PATENT DOCUMENTS

2021/0349040 A1* 11/2021 Miller ................ A61B 6/405
2022/0265231 A1*  8/2022 Shi .................... G01N 23/041

OTHER PUBLICATIONS

Berujon, S. et al., "X-ray Multimodal Tomography Using Speckle-Vector Tracking," Physical Review Applied (2016) 5:044014, 10 pages.
Lucas, B. D. et al., "An Iterative Image Registration Technique with an Application to Stereo Vision," Proc. 7th Intl. Joint Conf. on Artificial intelligence (IJCAI) (1981) Aug. 24-28, Vancouver, British Columbia, pp. 674-679.
Macwilliams, F. J. et al., "Pseudo-Random Sequences and Arrays," Proceedings of the IEEE (1976) 64(12):1715-1729.
Peters, W. H. et al., "Digital imaging techniques in experimental stress analysis," Optical Engineering (1982) 21(3):427-431.
Sutton, M. A. et al., "Determination of displacements using an improved digital correlation method," Image and Vision Computing (1983) 1(3):133-139.
Zdora, M.-C., "State of the Art of X-ray Speckle-Based Phase-Contrast and Dark-Field Imaging," Journal of Imaging (2018) 4:60, 36 pages.

* cited by examiner

SPECKLE-BASED IMAGING DIFFUSER AND METHOD FOR CONTROLLABLY FABRICATING SAME

RELATED APPLICATIONS

This application claims priority to U.S. Provisional Application No. 63/322,865, filed on Mar. 23, 2022, and entitled SPECKLE-BASED IMAGING DIFFUSER AND METHOD FOR CONTROLLABLY FABRICATING SAME, the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a random absorption mask for use in speckle-based x-ray phase contrast imaging and a method for fabricating such masks that can be adjusted to obtain the necessary absorption of x-ray light for different x-ray source energies.

BACKGROUND

Speckle-based x-ray phase contrast imaging (XPCI) is an imaging method that allows the x-ray absorption, micro-scatter, and refraction to be estimated for an x-ray beam projected through an object. An x-ray diffuser, for example, a mask, is placed in the x-ray beam path in front of the object. The x-ray beam passes through the mask to create a fine-grained intensity pattern overlaying the object in an x-ray imaging detector. The fine-grained intensity pattern may be formed due to the mask having x-ray absorption and/or x-ray phase-changing properties. Comparison of the pattern with and without the object present provides information that can be used to reconstruct x-ray absorption, micro-scatter (dark field), or refraction (phase change) images. The size and material composition of the diffuser particles are critical to performance of speckle based XPCI. See S. Berujon and E. Ziegler, "Near-field speckle-scanning-based x-ray imaging," Physical Review, vol. 92, art. no. 013837 (2015); S. Berujon and E. Ziegler, "X-ray Multimodal Tomography Using Speckle-Vector Tracking," Physical Review Applied, vol. 5, art. no. 044014 (2016); and M.-C. Zdora, "State of the Art of X-ray Speckle-Based Phase-Contrast and Dark-Field Imaging," Journal of Imaging, vol. 4, iss. 4, art. no. 60 (2018), the contents of each of which are incorporated herein by reference.

Currently, speckle-producing materials such as, for example, sandpaper, wire meshes, steel wool, and biological membranes are used as the mask. These masks are not ideal because of the lack of control over the degree of absorption and feature sizes. Further, these masks are not compatible with sources producing higher energy x-rays or broadband sources, typical of low-cost, portable x-ray systems. In addition, due to the nature of these masks, they are difficult to copy, making it almost impossible to duplicate imaging systems with equivalent performance.

Thus, the need exists for XPCI masks, and a method for making them, that should (1) have consistent statistics across the XPCI mask, (2) be locally unique to avoid ambiguous correlations, (3) have a speckle size on the order of the imaging system's resolution, (4) have a speckle pattern that is visible through the sample, and (5) be matched to the energy level of the imaging system and the sample density.

SUMMARY

The present invention relates to a mask for use in a speckle-based XPCI system and methods of making same. The desired properties of the XPCI mask are a strong function of the intended imaging system. For an imaging system employing a broadband source, the XPCI mask should primarily absorb the incident x-rays, though minor changes in phase may occur. Further, portable x-ray imaging systems are more likely to employ a broadband source of high energy x-rays, for example, having a mean energy of 30 keV or greater. In contrast, for an imaging system employing a narrowband source of low energy x-rays, the XPCI mask may change the phase of the substantially monochromatic x-rays, though some absorption may also occur. Low energy, monochromatic imaging systems are far larger and more expensive, and include, for example, synchrotrons that are used for material analysis. The XPCI mask in various embodiments has consistent statistics across the mask, is locally unique (thereby avoiding ambiguous correlations), has a speckle size on the order of the XPCI system's resolution, has a speckle pattern that is visible through the sample being imaged, and/or is matched to the energy level of the imaging system and the sample density. These mask attributes are controlled by the method and materials used in the fabrication of the mask.

Many of the same issues facing XPCI are also faced by neutron phase contrast imaging (NPCI). Fortunately, slight modifications of the XPCI masks will solve the corresponding issues faced by NPCI.

In at least one embodiment of the invention, a phase contrast imaging (PCI) mask comprises an illumination beam transparent substrate (the illumination beam transparent substrate transmitting an illumination beam), and an illumination beam affecting pattern formed on the illumination beam transparent substrate (the illumination beam affecting pattern including a plurality of mask sub-windows, each mask sub-window of the plurality of mask sub-windows including a unique two-dimensional (2D) pseudo-random binary array (PRBA), each 2D PRBA including a 2D array of PRBA PCI mask pixels, and each PRBA PCI mask pixel transmitting, absorbing, or changing a phase of the illumination beam).

In various embodiments, the illumination beam transparent substrate includes silicon, borosilicate glass, aluminosilicate glass, or lithium-aluminosilicate glass-ceramic; the illumination beam includes x-rays having a mean energy of at least 30 keV and the illumination beam affecting pattern includes cobalt, copper, gold, iridium, lead, nickel, niobium, platinum, silver, tin-silver, tin, tungsten, and/or zinc; the illumination beam includes x-rays having a mean energy of at least 30 keV and the illumination beam affecting pattern includes a seed layer (the seed layer including chrome, platinum, titanium, and/or titanium/gold); and the illumination beam affecting pattern further includes a second layer (the second layer formed on the seed layer, the second layer including cobalt, copper, gold, iridium, lead, nickel, niobium, platinum, silver, tin-silver, tin, tungsten, and/or zinc).

In other embodiments, the illumination beam includes neutrons having a mean energy of at least 2.5 meV and the illumination beam affecting pattern includes boron, cadmium, gadolinium, and/or samarium; the illumination beam affecting pattern has a thickness between approximately 10 µm and approximately 60 µm; each pixel in each 2D array of PRBA PCI mask pixels has a size between approximately 10 µm and approximately 200 µm; and the plurality of mask sub-windows forms a mask window and the mask window is tiled across the illumination beam transparent substrate.

In at least one embodiment of the invention, a method for fabricating a phase contrast imaging (PCI) mask comprises the steps of generating a pseudo-random binary sequence (PRBS), folding the PRBS to create a pseudo-random binary array (PRBA), specifying a pixel size and a mask size, pixelating the PRBA based upon the specified pixel size, converting the pixelated PRBA into a Graphic Design System stream format (GDS) file, creating a photolithographic mask based upon the GDS file, preparing a PCI mask substrate, and transferring a pattern on the photolithographic mask to the PCI mask substrate.

In various embodiments, the pixel size is between approximately 10 µm and approximately 200 µm; the step of converting the pixelated PRBA includes the step of tiling the pixelated PRBA based upon the specified mask size; the step of preparing the PCI substrate includes depositing a layer on the PCI mask substrate (the layer including boron, cadmium, chrome, cobalt, copper, gadolinium, gold, iridium, lead, nickel, niobium, platinum, samarium, silver, tin-silver, tin, titanium, tungsten, and/or zinc); the step of preparing the PCI substrate includes depositing a seed layer (the seed layer including chrome, platinum, titanium, and/or titanium/gold), and the step of transferring a pattern includes electrodepositing a layer of cobalt, copper, gold, iridium, lead, nickel, niobium, platinum, silver, tin-silver, tin, tungsten, and/or zinc on a portion of the seed layer; and the PCI mask substrate includes silicon, borosilicate glass, aluminosilicate glass, or lithium-aluminosilicate glass-ceramic.

In at least one embodiment of the invention, an x-ray phase contrast imaging (XPCI) mask comprises an x-ray transparent substrate (the x-ray transparent substrate transmitting an x-ray beam, the x-rays in the x-ray beam having a mean energy of at least 30 keV), and an x-ray affecting pattern formed on the x-ray transparent substrate (the x-ray affecting pattern including a plurality of mask sub-windows, each mask sub-window of the plurality of mask sub-windows including a two-dimensional (2D) array of first features and a respective second feature formed on each of the first features (each of the first features and respective second features absorbing or changing a phase of the x-ray beam)).

In various embodiments, the x-ray transparent substrate includes silicon, borosilicate glass, aluminosilicate glass, or lithium-aluminosilicate glass-ceramic; each of the first features is a solder wettable metal pad including copper, gold, nickel, platinum, and/or titanium, and each of the second features is a reflowed solder cap including antimony, bismuth, copper, indium, lead, silver, tin, and/or zinc; each of the first features is a seed layer including chrome, platinum, titanium, and/or titanium/gold, and each of the second features is an x-ray absorbing layer including cobalt, copper, gold, iridium, lead, nickel, niobium, platinum, silver, tin-silver, tin, tungsten, and/or zinc; and the plurality of mask sub-windows forms a mask window and the mask window is tiled across the x-ray transparent substrate.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION

Figure 1:
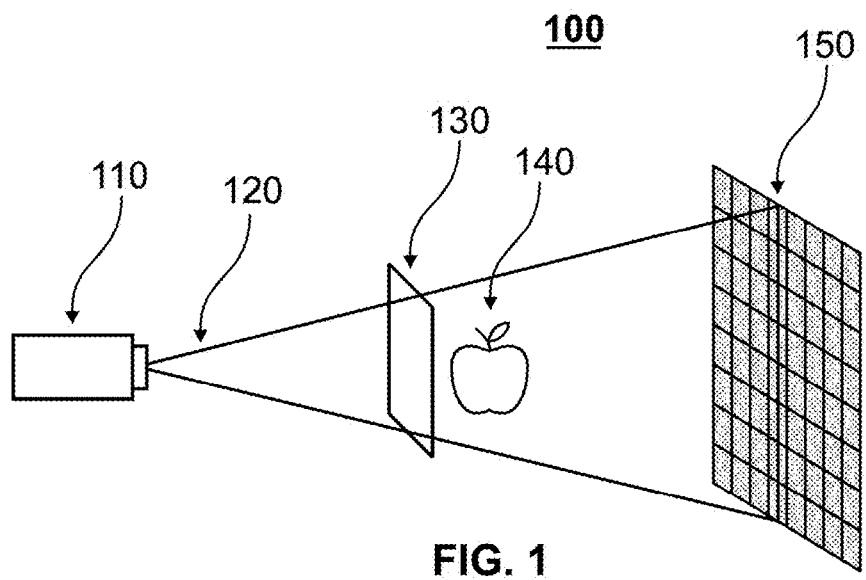
FIG. 1 illustrates a speckle-based x-ray phase contrast imaging (XPCI) system that employs an XPCI mask in accordance with one or more embodiments of the present invention.

FIG. 1 illustrates an overall speckle-based XPCI system 100. The speckle-based XPCI system 100 includes an x-ray source 110 that emits a beam of x-rays 120. An XPCI mask 130 is located between the x-ray source 110 and an object 140 being imaged. The beam of x-rays 120, having passed through the XPCI mask 130 and the object 140 being imaged, are then detected by an x-ray imaging detector 150, which has an array of x-ray sensing pixels. The speckle-based XPCI system 100 may magnify the object 140 being imaged in the reconstructed image, with the magnification being a function of the location of both the XPCI mask 130 and the object 140 with respect to the x-ray source 110 and the x-ray imaging detector 150. For example, the magnification will increase when the object 140 being imaged is moved closer to the x-ray source 110, while the magnification will decrease when the object 140 being imaged is moved closer to the x-ray imaging detector 150. As will be appreciated by one of skill, one faces a trade-off between magnification and blur when locating both the XPCI mask 130 and the object 140. In other embodiments, the XPCI mask 130 may be located between the object 140 being imaged and the x-ray imaging detector 150. In still other embodiments, the x-ray imaging detector 150 may employ film, which is subsequently developed and scanned, thereby generating a pixelated final image.

Speckle-based x-ray phase contrast imaging (XPCI) requires an XPCI mask that has random feature sizes. In certain embodiments, these random feature sizes may be on the order of magnitude of the size of the x-ray sensing pixels in the x-ray imaging detector. In certain embodiments, the XPCI mask also induces random degrees of absorption or phase change at each feature size. In accordance with one embodiment, an XPCI mask may be fabricated by combining photolithography to pattern solder wettable features (pads) having random dimensions onto an x-ray transparent substrate and then controllably deposit solder onto these features. The x-ray transparent substrate may be formed of any suitable material, for example, silicon or various types of glass (borosilicate glass, aluminosilicate glass, lithium-aluminosilicate glass-ceramic, etc.). After solder deposition, the x-ray transparent substrate is heated above the melting temperature of the solder to reflow the solder. When the solder melts and reflows, the solder wets the entire pad surface, thereby forming a solder cap, with the height of the solder cap being a function of the area of the pad and the volume of the solder deposited. The pad diameter may be any reasonable value, but pad diameters in the range of approximately 40 µm to approximately 120 µm may be employed and result in solder caps having usable heights and corresponding absorption. The pad thickness may be any reasonable value and is not critical, but pad thicknesses in the range of approximately 1 µm or less may be employed. While the method described here utilizes a commercial laser solder jetting tool to deposit the solder, this solder deposition method could be replaced with other standard solder deposition techniques, for example, solder preforms, solder printing, solder paste deposition, gang ball solder transfer, etc.

Figure 2:
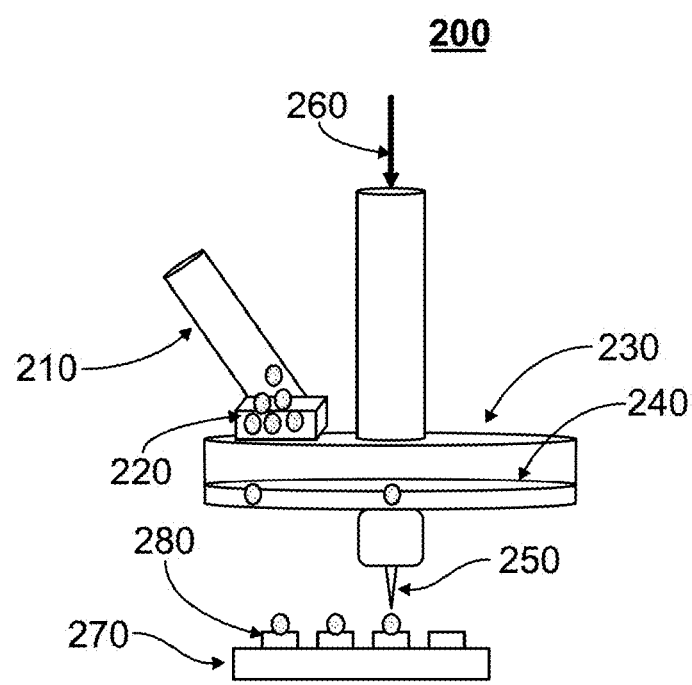
FIG. 2 illustrates the operation of a laser solder jetting tool that may be used to fabricate an XPCI mask in accordance with one or more embodiments of the present invention.

FIG. 2 illustrates the basic operation of a laser solder jetting tool 200. A hopper 210 holds many solder balls 220 that have a similar material composition and ball diameter. The bond head 230 has a singulation disk 240 to isolate and transfer a single solder ball 220 into a capillary 250. A laser beam 260 is then used to melt the single solder ball 220 and nitrogen pressure ejects the melted solder ball onto a substrate 270. The melted solder ball cools and solidifies when it lands on the substrate 270 and will stick to a pad 280. The pad 280 may, for example, be formed of copper, nickel, platinum, gold, etc., and will depend upon the need for the melted solder ball to readily wet the surface of the pad 280. Thus, different solder ball compositions may require different pad compositions. The pad 280 may also be formed of multiple layers of material, including, for example, an adhesion layer to promote adhesion of the pad 280 to the substrate 270. Titanium/platinum/gold is an example of a multi-layer pad structure. The laser solder jetting tool 200 may use a range of solder ball sizes, for example, between approximately 40 µm and approximately 250 µm. As the solder ball 220 will only wet the pad 280, a random pattern of x-ray absorbing features may be generated by employing different sizes of solder balls 220 and different sizes of pads 280 on a single substrate 270.

Figure 3A:
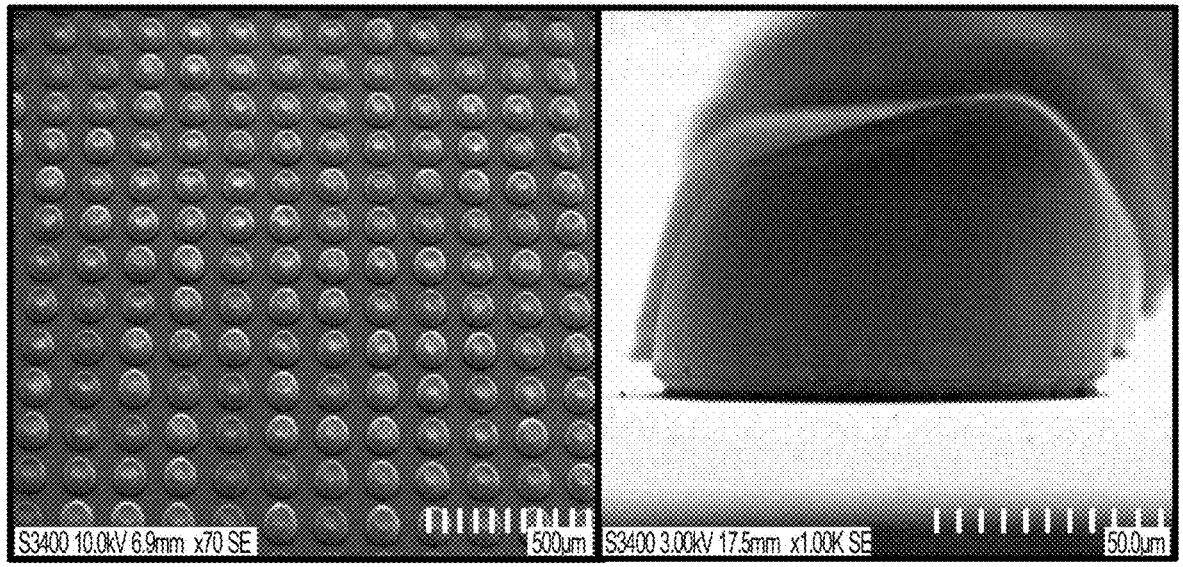
FIGS. 3A and 3B are photomicrographs of solder balls, before and after reflowing, respectively, that may be used in an XPCI mask in accordance with one or more embodiments of the present invention.
Figure 3B:
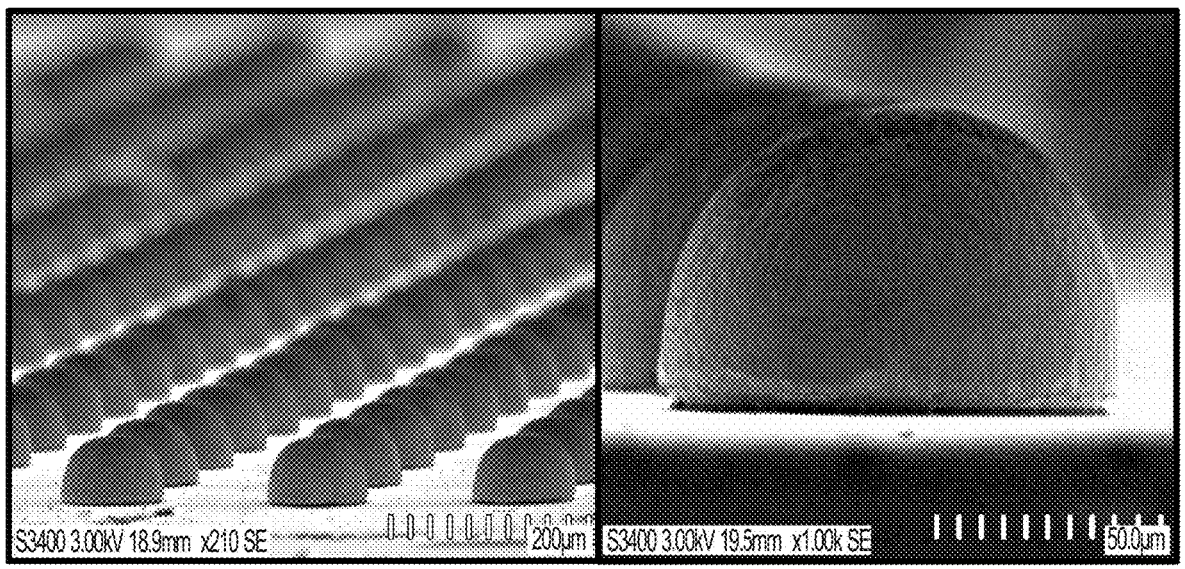

FIG. 3A is a photomicrograph of 80 µm diameter solder balls deposited onto 100 µm diameter pads that are patterned on a 150 µm pitch. FIG. 3A illustrates solder balls after deposition but before the solder is reflowed. The dimple in the top surface of the solder ball is a result of gravity as well as the nitrogen pressure during the deposition. When the solder ball is reflowed onto a pad, the resulting solder cap will expand to cover the entire surface of the pad and surface tension forces determine the thickness of the solder cap based on a relation between the area of the pad and the volume of the original solder ball, resulting in the solder cap having a spherical shape as illustrated in FIG. 3B. The temperature required for the solder reflow process depends upon the composition of the solder ball, but is typically in the range of 100 to 400° C. The solder may have any desired composition, and may, for example, include one or more of antimony, bismuth, copper, gold, indium, lead, silver, tin, or zinc.

The thickness of the solder cap can be approximated by solving for a height, h, for a volume of solder, $V_s$, in the equation for the volume of an ellipsoid $V_e$. The equation for the volume of a solder sphere, $V_s$, with a radius $r_s$, is:

$$V_s = \frac{4}{3} \times \pi \times r_s^3. \qquad \text{Eq. 1}$$

The equation for the volume of an ellipsoid with volume $V_e$, radius $r_p$, and height h is:

$$V_e = \frac{4}{3} \times h \times r_p^2. \qquad \text{Eq. 2}$$

Setting the volume of a sphere given by Equation 1 equal to the volume of an ellipsoid given by Equation 2 and then solving for the height, h, results in:

$$h = \frac{3}{2} \times \left( \frac{\frac{4}{3} \times \pi \times r_s^3}{\pi \times r_p^2} \right). \qquad \text{Eq. 3}$$

Figure 4:
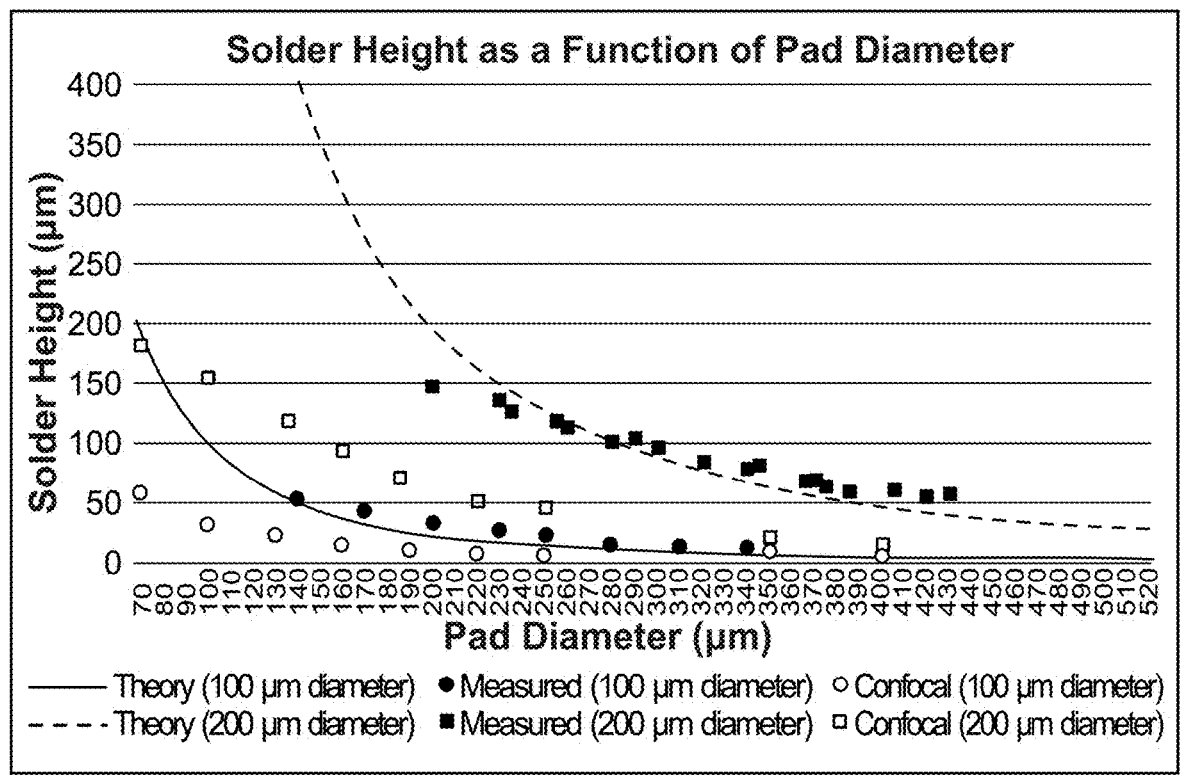
FIG. 4 is a plot approximating the theoretical and measured heights of solder caps for two different solder ball diameters deposited on pads with varying diameters for a solder ball-based XPCI mask in accordance with one or more embodiments of the present invention.

The resultant height, h, of a solder cap on a pad with a radius, $r_p$, can then be approximated for a solder ball with a radius, $r_s$. FIG. 4 illustrates a plot approximating the theoretical height, h, of a solder cap, as well as the measured height using both laser confocal imaging techniques and cross-section scanning electron microscopy (SEM) for two different solder ball diameters, 100 µm and 200 µm, deposited on pads with varying diameters. The x-axis is the pad diameter, and the y-axis is the height of the solder cap. Solid lines represent the theoretical solder height, while individual points represent the measured height using either laser confocal microscopy or SEM cross-sectional imaging.

Figure 5:
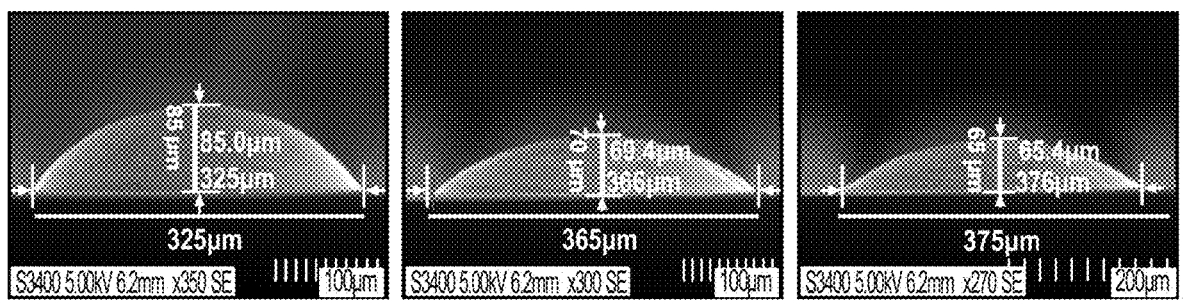
FIG. 5 is a set of photomicrographs of solder ball-based XPCI masks having 200 µm diameter solder balls deposited on varying pad diameters in accordance with one or more embodiments of the present invention.

FIG. 5 illustrates cross-sectional images of 200 µm diameter solder balls deposited on varying pad diameters and the change in height due to the reflow process resulting in the illustrated solder caps.

Figure 6:
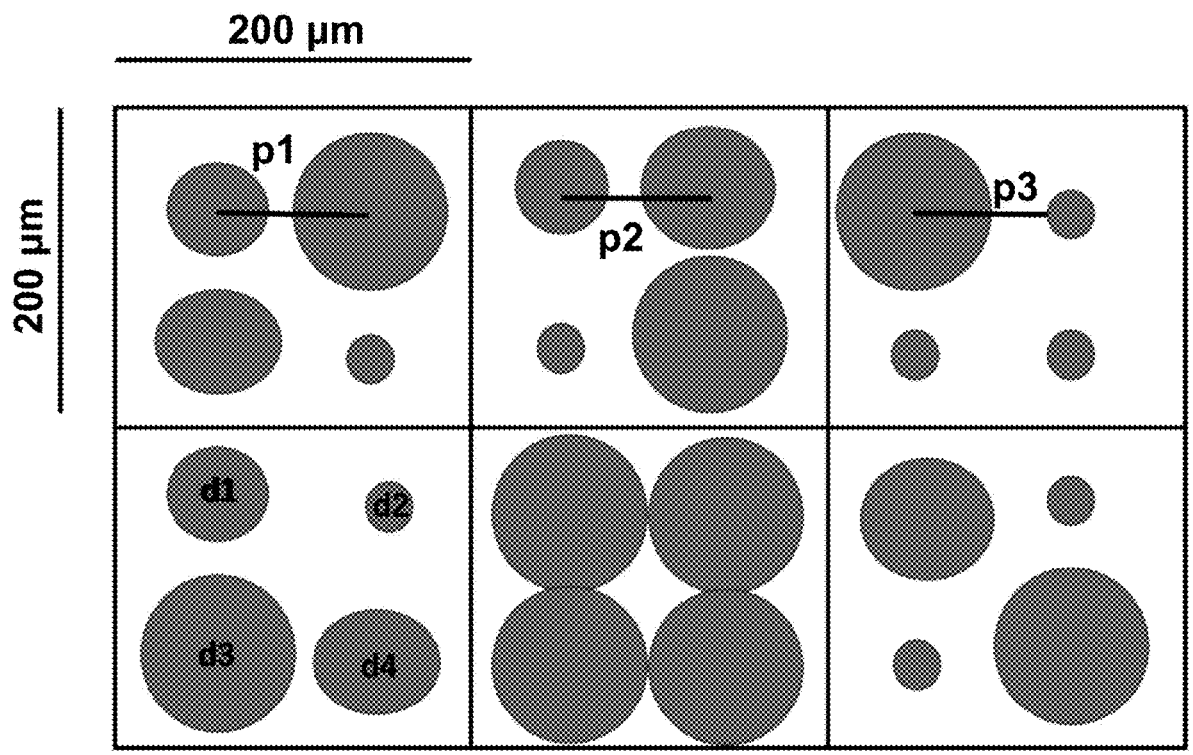
FIG. 6 is an illustration of discrete XPCI mask pixels defined on a photolithography mask having randomization with respect to both diameter and pitch between pads in accordance with one or more embodiments of the present invention.

To make an XPCI mask with varying feature diameters and solder cap thicknesses, which correlates to x-ray signal absorption, the above-mentioned attributes of reflowed solder balls on a pad are combined. A photolithography mask with randomly generated feature sizes, positions, and shapes is generated to pattern the solder wettable metal into pads. Multiple pads are defined with various diameters, d, and pitches between pads, p, as illustrated in FIG. 6. FIG. 6 illustrates a grid of mask sub-windows with a mask sub-window dimension of 200 μm×200 μm, but this mask sub-window dimension can be adjusted as necessary as it is not critical to the design (it serves to aid in the pattern layout process for the layout software). Within each mask sub-window, a random number generator is used to determine the pad diameters, d, as well as the pitch between pads, p. While the pads in FIG. 6 are depicted as circles, other embodiments may employ pads with other geometric shapes. The individual mask sub-windows are then combined to form an overall mask window. If the overall mask window is not large enough, then multiple copies of the mask window may be tiled to create the desired mask size. The (tiled) mask window(s) are then used to generate an overall photolithography mask compatible with standard photolithography processes. The photolithography mask is subsequently used to pattern photoresist, which, when used with metal deposition techniques, results in a solder wettable metal pad pattern across an x-ray transparent substrate.

As will be appreciated by those of ordinary skill in the art, there are many alternative ways of generating randomness in the pattern of the pads. For example, an algorithm employing a random number generator can be made to randomly place pad features of any size or shape across the full area of the photolithography mask.

Once the photolithography mask is used to pattern the solder wettable metal into pads on the x-ray transparent substrate, solder, for example in the form of solder balls, is then deposited on each of these pads and then reflowed to form the solder caps on the pads. After the solder is reflowed, a random absorption XPCI mask is realized for use in XPCI.

Figure 7:
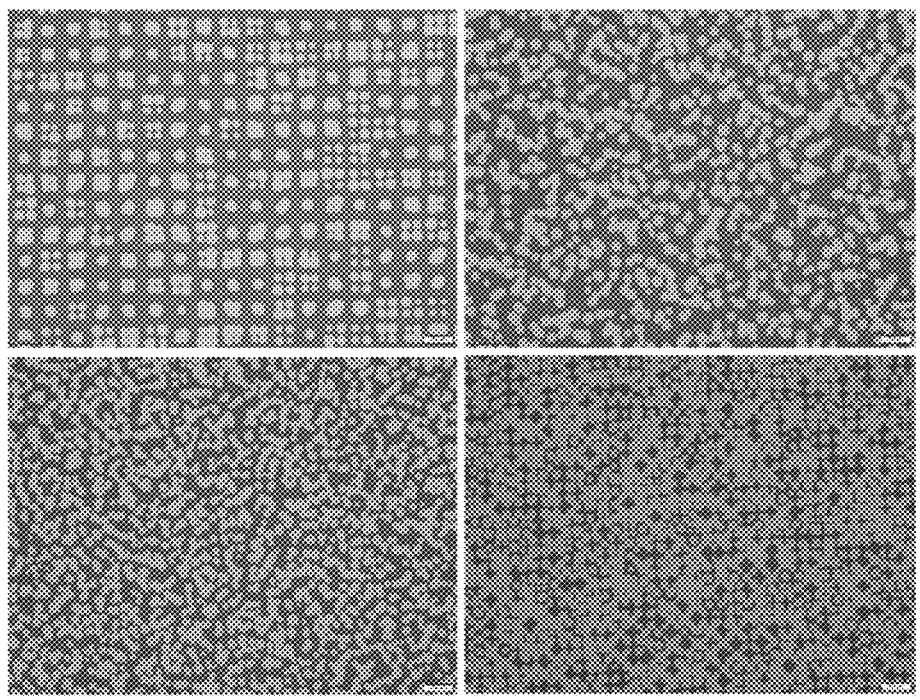
FIG. 7 is a set of photomicrographs of XPCI masks made using a gold electrodeposition process in accordance with one or more embodiments of the present invention.

In some embodiments, a gold electrodeposition process may be used as opposed to the solder ball process just described. These embodiments are especially useful for imaging systems employing higher energy sources due to the greater absorption of x-rays by gold (though gold solder balls may be used with a solder jetter). The gold electrodeposition can also produce smaller feature sizes than those possible using the solder ball process, thereby enabling smaller x-ray sensing pixels for the x-ray imaging detector. The feature sizes when using gold electrodeposition may range, for example, from approximately 10 μm to approximately 200 μm, though this will depend on the aspect ratio of height to width of the feature as sufficient x-ray absorption is required. A typical aspect ratio of height to width for gold features is 3:1, thus, greater absorption can be obtained for wider features of a given material. Electrodeposition is generally a faster process, is more amenable to large area substrates, and offers better control over lateral and thickness dimension of the features. Further, the gold electrodeposition process can be layered, allowing one to create variable absorption. In FIG. 7 are four photomicrographs of XPCI masks made using this gold electrodeposition process. The gold electrodeposition process employs a seed layer deposited on the x-ray transparent substrate, for example, a thin film stack of titanium and gold, with the titanium acting as an adhesion layer for the gold. Other electrically conductive materials may also be used for the seed layer. The seed layer can be of any thickness, so long as it provides a continuous conductive blanket film compatible with the electrodeposited material. For example, 20 nm of titanium may be used for adhesion promotion and 200 nm of gold may be used as the seed material for gold electrodeposition. Photoresist is spin coated on the seed metal and cured. The photoresist is exposed using a photolithographic mask to define the areas that are ultimately to be electroplated. When developed, the exposed areas of photoresist are removed and the unexposed areas remain, thereby forming a patterned mold with a conductivity path for electrodeposition. An electrodeposition process deposits gold on the exposed portion of the seed layer, growing the gold inside the patterned mold. The photoresist and the portion of the seed layer under the photoresist can then be removed. This process is known as a "through-mask" electrodeposition process. While the above-described process employed a gold electrodeposition process, other materials may be used, for example, cobalt, copper, iridium, lead, nickel, niobium, platinum, silver, tin-silver, tin, tungsten, or zinc. The key is selecting a material that is both amenable to electrodeposition and strongly absorbs x-rays at the intended energy. As will be appreciated by one of skill, the composition of the seed layer will be a function of the desired electrodeposited material.

Figure 8:
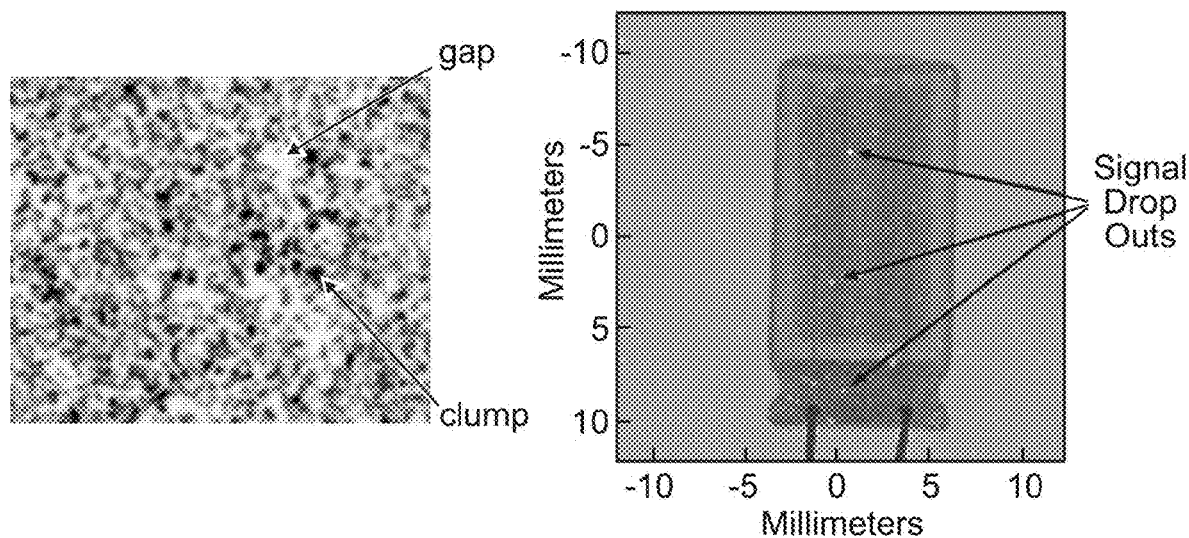
FIG. 8 is a photomicrograph of an XPCI mask in accordance with one or more embodiments of the present invention and a corresponding XPCI with imaging artifacts.

In yet other embodiments, metal particles may be scattered on an adhesive layer on an x-ray transparent substrate to form an XPCI mask, with the metal particles forming a two-dimensional (2D) x-ray absorbing matrix. For example, an x-ray absorbing tungsten powder or solder balls may be scattered on a sheet of adhesive paper, which is transparent to x-rays. While these embodiments employ a very simple fabrication process, their performance can suffer. Specifically, the metal particles in the 2D x-ray absorbing matrix may be too random, resulting in gaps (particle density too low) or clumps (particle density too high). These gaps and clumps can lead to signal drop-outs in the resulting image, as illustrated in FIG. 8. The fabrication process can be improved by controlling the metal particle size distribution, using a sifting process to distribute the metal particles, and using a vibrating plate, each of which may improve randomness while reducing gaps and clumps.

Still other embodiments address the issue of gaps/clumps and their attendant signal drop-outs. These embodiments again employ a very simple fabrication process: the spraying of a metal containing compound on an x-ray transmissive substrate, thereby also creating a 2D x-ray absorbing matrix. For example, a cold galvanizing compound spray paint containing x-ray absorbing zinc may be sprayed on card stock, which is transparent to x-rays. This process offers significant flexibility as the density of the cold galvanizing compound, and thus the zinc density, i.e., the density of the 2D x-ray absorbing matrix, can be easily varied for a specific imaging system. The resulting XPCI masks are especially useful for imaging systems employing lower energy sources as the zinc is less absorbing at the lower energies than, for example, tungsten. As will be appreciated by one of skill, this process can very quickly and inexpensively produce a zinc-based XPCI mask. Further, while this specific embodiment used a zinc-based cold galvanizing compound, other materials may be used to better tune the absorption properties to the energy of the x-ray source.

Figure 9:
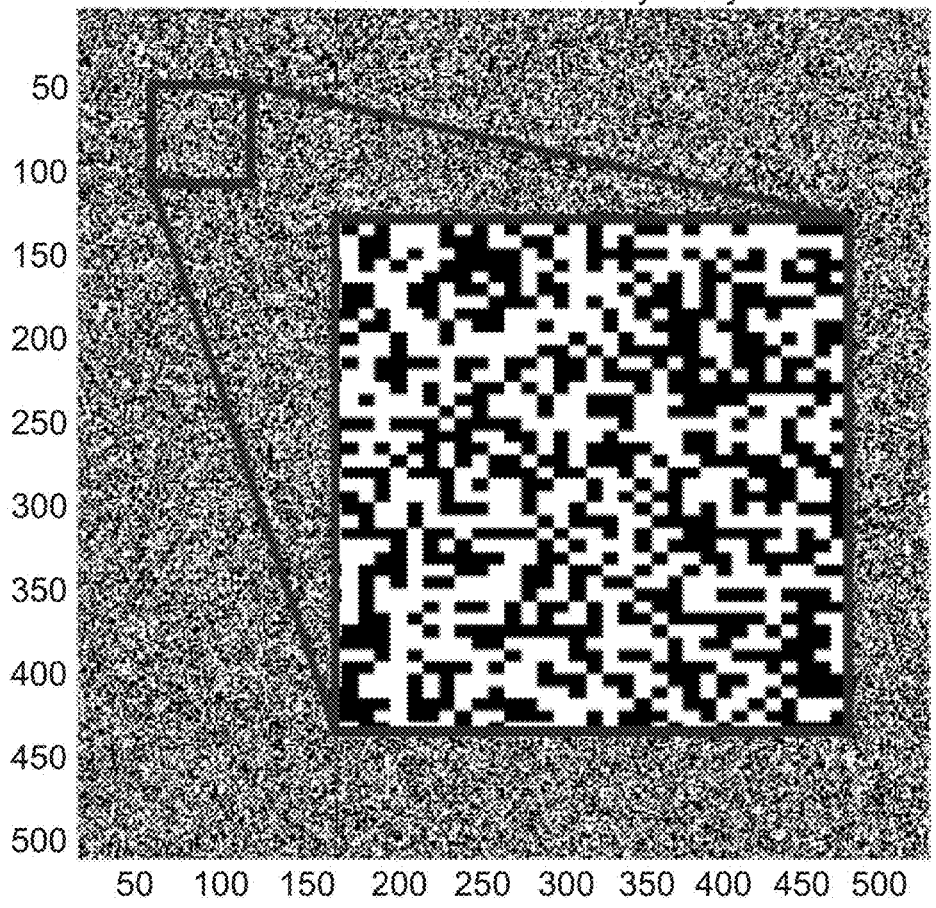
FIG. 9 illustrates an XPCI mask formed using a two-dimensional (2D) pseudo-random binary array (PRBA) in accordance with one or more embodiments of the present invention.

In another broad category of embodiments, the XPCI mask is formed using a 2D pseudo-random binary array (PRBA), with an example of a window used to form a 2D PRBA XPCI mask illustrated in FIG. 9. FIG. 9 also illustrates a magnified portion of the window with multiple sub-windows. The design process for a 2D PRBA mask employs two steps. In the first step, a pseudo-random binary sequence (PRBS) is generated. See F. J. MacWilliams and N. J. A. Sloane, "Pseudo-Random Sequences and Arrays," in Proceedings of the IEEE, 1976, vol. 64, no. 12, pp. 1715-1728 (1976), the contents of which are incorporated herein by reference, for a discussion on generating the PRBS. A PRBS of maximum length $n=2^m-1$ can be generated using an m-bit shift register. The initial shift register is generated using a seeded random number generator. Given the construction of the sequence from the linear shift register, the same PRBS is produced for any specific initial m-bit shift register, so the PRBS is not truly random. In the PRBS, each individual element is either a "1" or a "0," corresponding to either a filled (absorbing) or open (transparent) pixel in the resultant 2D PRBA XPCI mask.

Once the PRBS has been generated in the first step of the design process, it is folded into a PRBA having a size n1×n2 in the second step of the design process. The columns of the PRBA, with each column having a height of $2^{k1}-1$, are filled with shifted copies of the PRBS, where a subarray within the PRBA has a size k1×k2. The size (total number of elements $n_{SA}=k1*k2$) of the subarray and the size (total number of elements n=n1*n2) of the PRBA are related as follows:

$$n=2^{k1 k2}-1 \text{ and} \qquad \text{Eq. 4}$$

$$n_1=2^{k1}-1. \qquad \text{Eq. 5}$$

Of particular note is that every possible k1×k2 subarray appears exactly once in the overall PRBA. This k1×k2 unique subarray, and more specifically its corresponding sub-window in the ultimate 2D PRBA XPCI mask, can be used to uniquely locate the position of an observed pattern. This is a key benefit to the use of a PRBA in the generation of a speckle mask for XPCI. It also allows one to produce a random pattern in a controlled, repeatable, and known way.

The following describes one method of folding the PRBS to construct the PRBA, though other embodiments may employ different methods of folding the PRBS to construct the PRBA. First, the elements of the PRBS are written down the main diagonal of the PRBA, and then continue from the opposite side of the PRBA whenever an edge of the PRBA is reached. For example, the elements of the PRBS are identified as $s_0\ s_1\ s_2\ s_3\ s_4\ \ldots\ s_{n-1}$, and the elements of the PRBA are identified as follows:

| | | | |
|---|---|---|---|
| $b_{i,j}$ | $b_{i,j+1}$ | $b_{i,j+2}$ | ... |
| $b_{i+1,j}$ | $b_{i+1,j+1}$ | $b_{i+1,j+2}$ | ... |
| ... | | | ... |
| ... | | | $b_{n1,n2}$ |

The $b_{i,j}$ elements of the PRBA are arranged from the PRBS elements $s_p$ by:
% i=p mod n1
% j=p mod n2
% Example: $s_0\ s_1\ s_2\ \ldots$
% $s_0$: i=0 mod n1
% j=0 mod n2
% $b_{0,0}$
%

This PRBA algorithm used to fold the PRBS to construct the PRBA may employ, for example, a tool such as MATLAB®.

The PRBA itself is merely a specification of the number of elements in the PRBA and their state, either "1" or "0." The PRBA is thus agnostic to physical dimensions, at the element level or as a full array. The PRBA design can then be uploaded into a photolithography mask layout tool. It is at this point that both the size of the pixels in the 2D PRBA XPCI mask is specified, as well as the desired size of the overall 2D PRBA XPCI mask. The size of the pixels in the 2D PRBA XPCI mask may, for example, have a size between approximately 10 μm and approximately 200 μm, though this will depend on the aspect ratio of height to width of the feature. Being able to specify the size of the pixels is beneficial because it allows one to optimize the PRBA XPCI mask for a given application. For example, one may specify the size of the PRBA XPCI mask pixel in view of the magnification for a given imaging system, i.e., application. Further, because one can use the same PRBA design with different pixel sizes, one can directly compare different imaging systems having different magnifications by using the same underlying PRBA design.

A window of the 2D PRBA XPCI mask corresponds to the pixelated transformation of the PRBA. As an example, if the pixel size is 10 μm on a side and there are 1024 pixels on a side in the PRBA, the physical size of the corresponding window is 1024*10 μm=10,240 μm, i.e., 10.24 mm on a side. If the desired size of the overall 2D PRBA XPCI mask is larger than the window, the window can be tiled. Note that there is no requirement that the tiling occur as whole integers of the window. Using the above example and a desired size of the overall 2D PRBA XPCI mask of 25.6 mm on a side, the window would be tiled 2.5 times in each direction. While tiling the window will result in individual sub-windows within the overall 2D PRBA XPCI mask no longer being unique, i.e., a given sub-window will occur in each tiled window, the separation between the copies of the given sub-window will be sufficient for speckle-based phase contrast. Specifically, only uniqueness within the neighboring vicinity is required.

Once the 2D PRBA XPCI mask has been designed, a tool, for example a customized MATLAB® script, translates the binary sequence of pseudorandom numbers into a Graphic Design System stream format (GDS-II) file. The script interprets each bit of the 2D PRBA XPCI mask design by generating an opaque pixel (resulting in chrome at that pixel location on the photolithographic mask) when a '1' bit is encountered. Conversely, the script generates a clear pixel (resulting in no chrome at that pixel location on the photolithographic mask) when a '0' bit is encountered. This data can be inverted or not, giving the option of producing the mask as a negative of the drawing depending on the polarity preference for the photolithography process. As will be appreciated by one of skill, the mask will have a polarity that depends upon whether one will be employing a positive or a negative photoresist when transferring the pattern on the photolithographic mask to the PRBA XPCI mask.

Due to the nature of the PRBA design process, it offers several advantages not possible with the other disclosed embodiments. These advantages include being able to control the randomness and pattern thickness. The small PRBA XPCI mask pixel size and the ease with which the PRBA XPCI mask can be fabricated are additional benefits. Each of these will be addressed in turn.

First, the term "randomness" in this context means the probability of all values is approximately the same, i.e., the probability distribution is essentially uniform. In contrast, some "natural" random processes may have a Gaussian distribution as certain values, for example, particle size, may naturally be favored over other values (larger or smaller particle sizes). With this definition for randomness, one may control it by employing a suitable random value generating algorithm. Being able to control randomness is beneficial in that while the resultant binary array is random, it is also known, which, as will be discussed below, simplifies the task of reconstructing an image of an object being imaged. In contrast, a naturally random process will produce an unknown array that can complicate the task of reconstructing the image of the object being imaged, though this can be overcome by, for example, taking a reference image, i.e., an image with just the mask (no object).

Second, the term "pattern thickness" in this context means the thickness of the metal layer used in forming the PRBA XPCI mask. The pattern thickness impacts the absorption of the x-rays by the PRBA XPCI mask, with greater pattern thickness providing more absorption, i.e., greater contrast between the transmitting (white) or absorbing (black) PRBA XPCI mask pixels. Further, when multiple PRBA XPCI mask pixels fall on a single x-ray sensing pixel, one can achieve an additional degree of randomness from the resultant grayscale due to multiple PRBA XPCI mask pixels falling on a single x-ray sensing pixel. With this definition for pattern thickness, one may control it during the PRBA XPCI mask fabrication process, for example, by controlling the electrodeposition time and/or rate. Being able to control the pattern thickness is beneficial because it allows a PRBA XPCI mask to be optimized for a given application. For example, the pattern thickness can be optimized as a function of the x-ray source energy.

Figure 10:
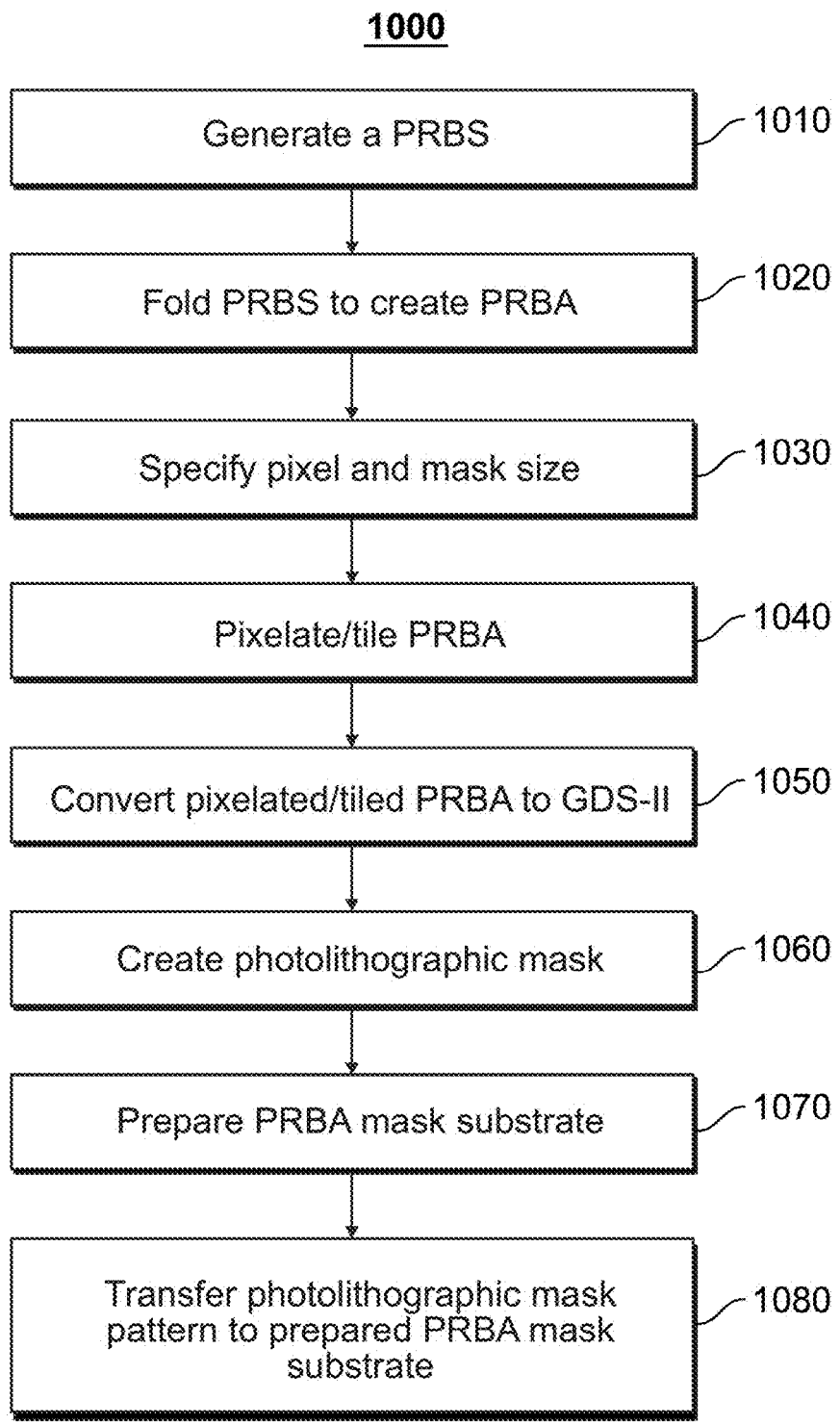
FIG. 10 is a flowchart of the process used to fabricate an XPCI mask formed using a 2D PRBA in accordance with one or more embodiments of the present invention.

The ease with which the PRBA XPCI mask can be fabricated is best demonstrated by FIG. 10, which is a flowchart of the PRBA XPCI mask fabrication process 1000. In step 1010, the PRBS is generated. In step 1020, the specific pattern for a window is determined by folding the PRBS onto the window, resulting in the PRBA. In step 1030, the sizes of the PRBA XPCI mask pixel and the overall mask size are specified, and will be a function of, for example, the specific application. In step 1040, the PRBA will be pixelated and, if needed, tiled to form the final PRBA design. In step 1050, the PRBA design is converted into a GDS-II file. In step 1060, a photolithographic mask is created from the GDS-II file. In step 1070, the PRBA XPCI mask substrate is prepared. This substrate preparation may include depositing a layer of metal on an x-ray transparent PRBA XPCI mask substrate and then coating the metalized PRBA XPCI mask substrate with photoresist. In step 1080, the pattern on the photolithographic mask is transferred to the x-ray transparent PRBA XPCI mask substrate using a photolithographic process, for example, exposing and developing the layer of photoresist, and an etching step that removes the portion of the metal layer on the PRBA XPCI mask substrate that is not protected by the photoresist. The output from step 1080 is the completed PRBA XPCI mask. In other embodiments, steps 1070 and 1080 may employ the above described "through-mask" electrodeposition process. Steps 1070 and 1080 may be repeated as necessary to produce the desired number of PRBA XPCI masks.

The layer of metal on the x-ray transparent PRBA XPCI mask (step 1070) may include, for example, gold, tungsten, or zinc, depending on the x-ray energy and desired degree of absorption for a given application. The layer of metal on the PRBA XPCI mask may have any desired pattern thickness (within fabrication limits), though a pattern thickness between approximately 10 µm and approximately 60 µm or more will suffice for many applications, though this will depend on the aspect ratio of height to width of the feature. The metal layer may be deposited, for example, using an evaporation process or an electrodeposition process. If an electrodeposition process is employed, a seed layer may be deposited on the PRBA XPCI mask substrate prior to the photoresist, i.e., in step 1070. The seed layer may be formed, for example, of chrome, platinum, titanium, titanium/gold, or other conductive material. Once the photoresist has been patterned in step 1080, the PRBA XPCI mask substrate undergoes the electrodeposition process, such as the through-mask electrodeposition process describe above, which thereby deposits a second metal, for example, gold, on the exposed portion of the seed layer. The photoresist and the portion of the seed layer under the photoresist can be removed and the through-mask electrodeposition process is complete. Both the type of metal and the thickness of the metal layer, i.e., the pattern thickness, are typically selected based upon the energy level employed by a specific imaging system. It should be noted that high aspect ratio features may be difficult to fabricate. These high aspect ratio features can arise, for example, when a small pixel size is required in a very high energy application, which requires a thick electrodeposition process.

Once an overall PRBA pattern has been designed, i.e., step 1020, one can make different versions of the PRBA XPCI mask, all having the same PRBA pattern. These different versions may employ PRBA XPCI mask pixels with different lateral dimensions. In addition, or in the alternative, these different versions may employ different thicknesses for the metal mask layer, i.e., pattern thicknesses. Thus, a single PRBA pattern can be employed for different systems or different applications by optimizing the lateral dimensions and metal thickness as a function of the x-ray source energy and the imaging geometry.

The fabrication process illustrated in FIG. 10 is simpler than the process required by the solder ball and reflow XPCI mask. Specifically, once the pattern on a photolithographic mask is transferred to a solder cap XPCI mask substrate using a photolithographic process (generally corresponding to step 1080), the solder balls themselves must be deposited on the solder cap XPCI mask substrate followed by a reflow process. The minimum size of the solder balls limits the minimum size of the solder caps. As the minimum size of the PRBA XPCI mask pixel may be more than an order of magnitude less than the minimum size of the solder balls, one can far better tune the PRBA XPCI mask to a specific imaging system, especially if the imaging system employs higher energy levels.

Figure 11C:
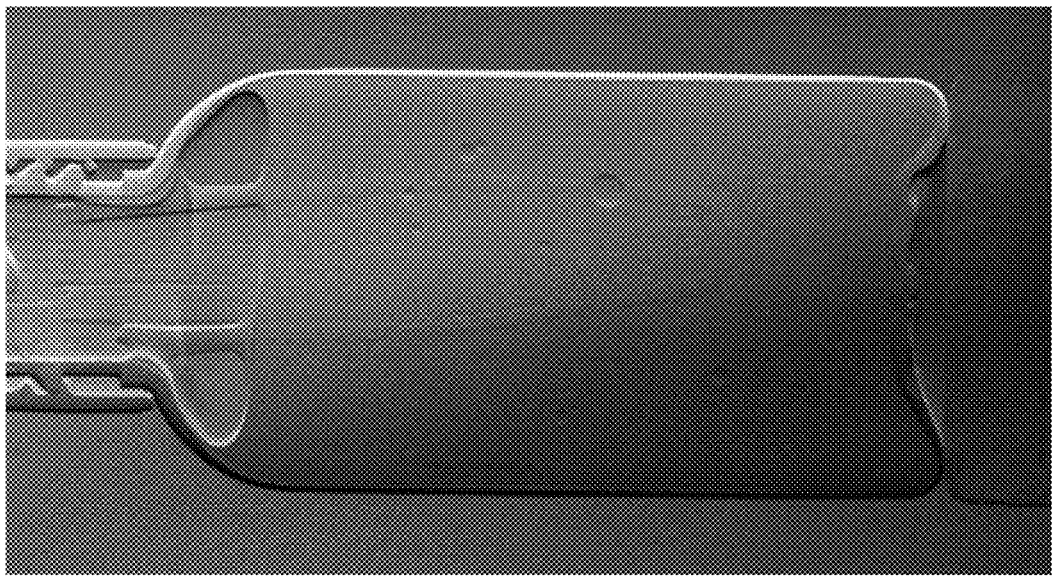
FIGS. 11A-11C are absorption, dark field, and differential phase images, respectively, with each image taken with an XPCI mask in accordance with one or more embodiments of the present invention.
Figure 11B:
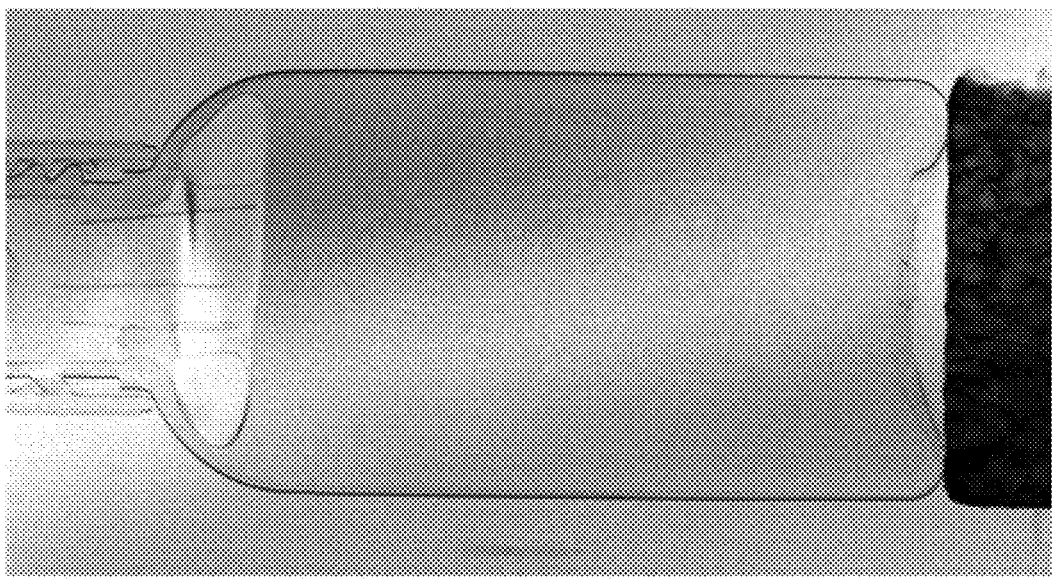
Figure 11A:
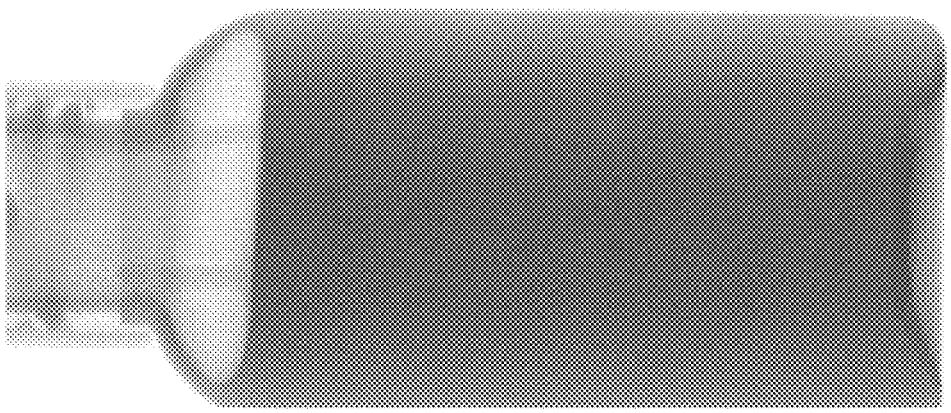

FIGS. 11A-11C are absorption, dark field, and differential phase images of a plastic spoon handle immersed in a bottle of hand sanitizer gel, with the bottle sitting on a block of foam. The images in FIGS. 11A-11C are based on a single dataset, which was taken with a PRBA XPCI mask in accordance with at least one embodiment, but with the dataset processed differently for each image. The bottle, the gel, and the spoon handle are all low density materials with similar density. As illustrated in FIG. 11A, absorption, which is based on density and has low-contrast for low density materials, does a poor job of differentiating between the materials. Specifically, the spoon handle cannot be seen inside the gel. The bottle boundaries are invisible. The boundaries of the spoon handle above the gel surface are blurry and ill defined. The inner region of spoon handle appears to have the same attenuation as outside it raising the question of whether the spoon handle is a solid object.

The dark field image of FIG. 11B arises from ultra-small angle scatter in sub-resolution microstructure. Neither the gel nor the spoon handle has microstructure, so the signal below the surface of the gel is not interesting. However, the foam beneath the bottle shows complex microstructure not apparent in FIGS. 11A and 11C. The bottle edges including the neck and cap, and the spoon handle edges, including a crack in the handle, are observed with high contrast in the dark field image of FIG. 11B.

The differential phase image of FIG. 11C shows interfaces between materials with high contrast. Plastic, air bubbles, and gel are all low density materials with similar densities, however the boundaries between each of these materials is apparent with high contrast in FIG. 11C. In FIG. 11C, one can count air bubbles, and identify the spoon handle and its edge ridge (the vertical striations along the handle), which are apparent both in the gel and above the gel. The crack in the spoon handle is precisely localized, the bottle edges are clearly defined, and the inner surface of the bottom of the bottle can be clearly distinguished.

Figure 12A:
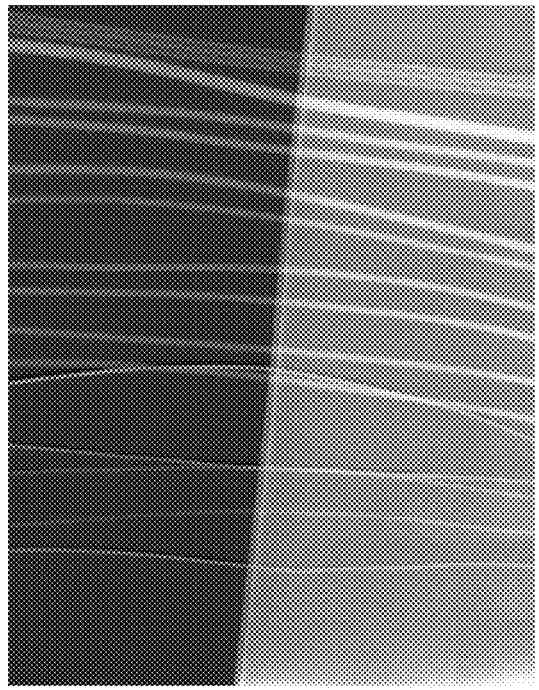
FIGS. 12A-12D are absorption, dark field, vertical refraction, and horizontal refraction phase images, respectively, with each image taken with an XPCI mask in accordance with one or more embodiments of the present invention.
Figure 12B:
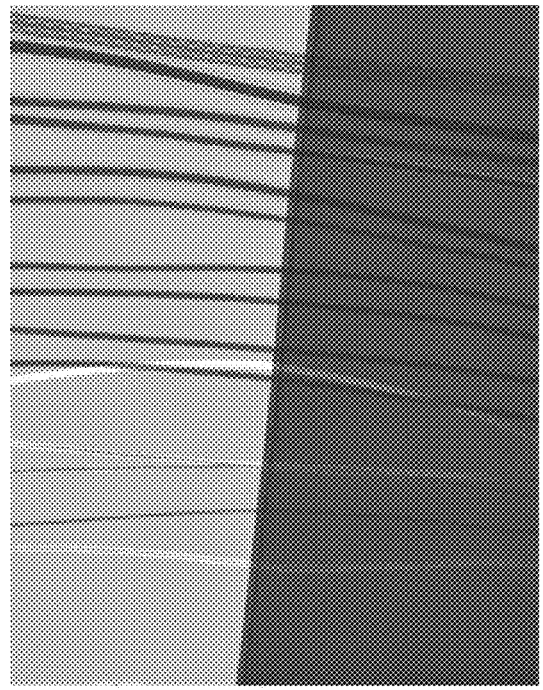
Figure 12C:
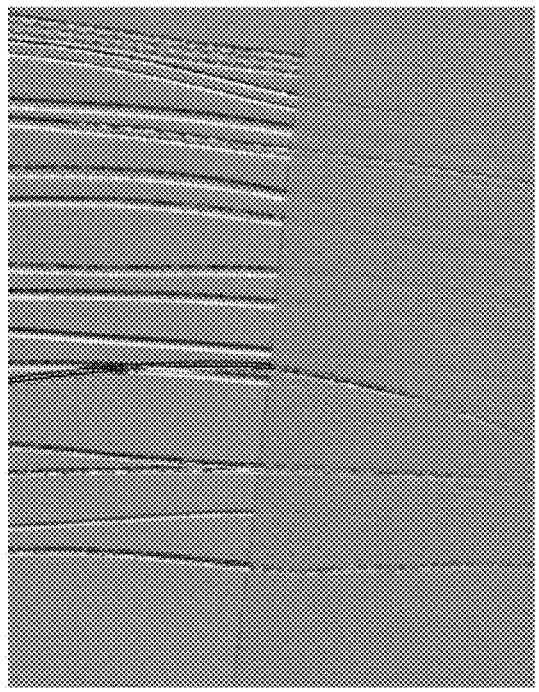
Figure 12D:
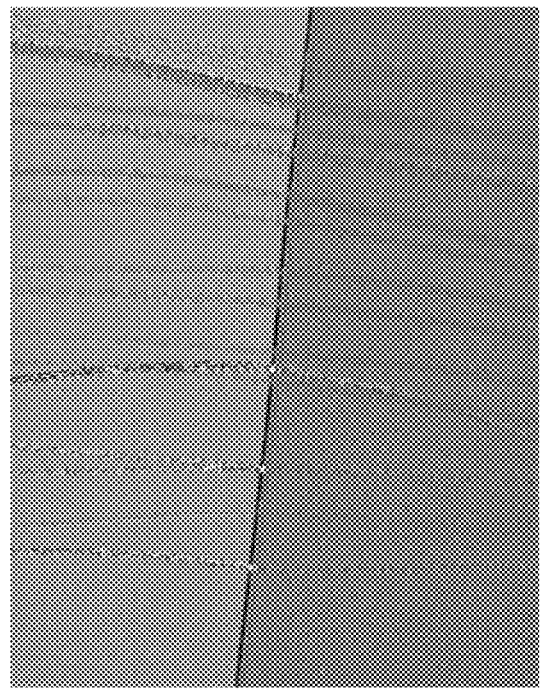

FIGS. 12A-12D are images of various gauge wires, some single, some stranded, with corresponding insulation. The right side of the field of view in each of FIGS. 12A-12D is behind a copper plate. The images in FIGS. 12A-12D are based on a single dataset, which was taken with a PRBA XPCI mask in accordance with at least one embodiment having 35 µm features, and was acquired at 80 kV. The image data were sampled using random stepping inside a 20 mm×20 mm box. The reconstructions in FIGS. 12C and 12D use digital image correlation methods. See M. Sutton et al., "Determination of displacements using an improved digital correlation method," Image and Vision Computing, vol. 1, no. 3, pp. 133-139 (1983), the contents of which are incorporated herein by reference. In the absorption image of FIG. 12A, the wires have strong contrast. This contrast is reduced behind the attenuating copper plate, as expected. In the dark field image of FIG. 12B, the wires have high contrast and now the insulation materials are apparent where they are non-existent in the absorption image of FIG. 12A. The dominant refraction direction for the horizontal wires is in the vertical direction, as illustrated in FIG. 11C, where there are clearly delineated boundaries between the wire and the insulation and between the insulation and air. Again, the phase contrast is reduced behind the copper plate. There is also some horizontal refraction, as illustrated in FIG. 12D, that occurs principally in the insulation.

Returning to FIG. 1, a typical portable X-ray source 110 produces a cone shaped beam of x-rays 120, i.e., the beam of x-rays 120 is expanding as it propagates, resulting in magnification. Assume for purposes of the following that the scenario illustrated in FIG. 1 produces a 2× magnification. In this case if the XPCI mask 130 is a PRBA XPCI mask with a pixel size of 30 µm, then at the x-ray imaging detector 150 the projected image of the pixels is 60 µm. If the pixels of the X-ray imaging detector 150 are also 60 µm and the PRBA XPCI mask 130 is aligned to the X-ray imaging detector 150, then the binary "on" or "off" pattern of the PRBA pattern is preserved.

Figure 13A:
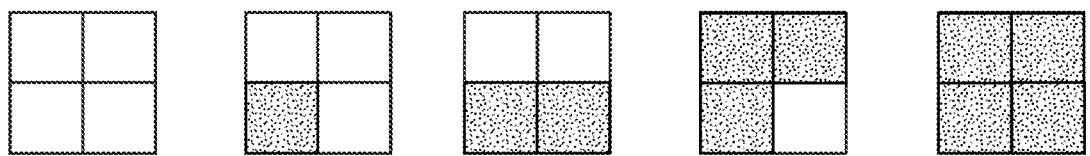
FIGS. 13A and 13B illustrate the effect of magnification of an XPCI mask formed using a 2D PRBA in accordance with one or more embodiments of the present invention.
Figure 13B:
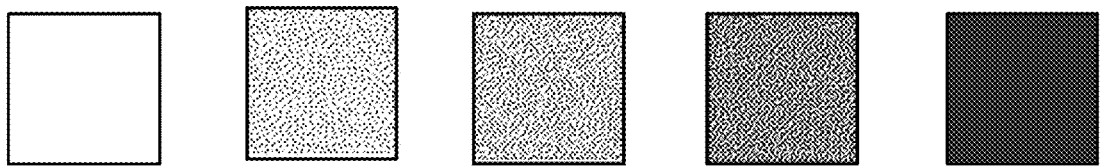

In other embodiments, if the pixels of the X-ray imaging detector 150 are larger, for example, 120 µm, then four pixels of the PRBA XPCI mask 130 are averaged by a single pixel in the X-ray imaging detector 150. Across the array of the X-ray imaging detector 150 this would create 5 discrete greyscale values. If 0, 1, 2, 3, 4 of the four corresponding pixels of the PRBA XPCI mask 130 are "off," as illustrated in FIG. 13A, the corresponding pixel in the X-ray imaging detector 150 will output the values of maximum, 0.75 of maximum, 0.5 of maximum, 0.25 of maximum, and 0, respectively, as illustrated in FIG. 13B. When the pixels of the X-ray imaging detector 150 are larger than the projected image of the pixels of the PRBA XPCI mask 130, this causes a reduction of the designed randomness. Further, there is no longer a guarantee of a unique sub-window of the PRBA XPCI mask 130 within a given vicinity on the X-ray imaging detector 150.

In still other embodiments, if the pixel size of the PRBA XPCI mask 130 is such that the magnified image of the PRBA XPCI mask 130 has pixels larger than the pixels of the X-ray imaging detector 150, multiple pixels of the X-ray imaging detector 150 resolve individual speckle mask features. As an example, if the pixel size for the PRBA XPCI mask 130 is 60 µm, they will be magnified to 120 µm on the X-ray imaging detector 150. If the pixel size of the X-ray imaging detector 150 is 60 µm, four pixels of the X-ray imaging detector 150 will resolve each pixel of the PRBA XPCI mask 130. This may increase the resolution of the PRBA XPCI mask 130 and, when a single pixel of the PRBA XPCI mask 130 falls on an integer number of pixels of the X-ray imaging detector 150, a greyscale effect may again result.

Many variations on this scenario can be created where the size of the pixels of the PRBA XPCI mask 130 are intentionally selected based on the anticipated magnification factor of the speckle-based XPCI system 100 and the size of the pixels in the X-ray imaging detector 150 that will be used. The desired relative pixel sizes of the PRBA XPCI mask 130 and the X-ray imaging detector 150 depend on the reconstruction algorithms that will be used, whether the unique sub-window feature of the PRBA will be used to advantage or if a PRBA is simply a convenient way of engineering a repeatable random pattern so the speckle statistics are homogenous, but maintaining the unique sub-window is not essential.

In yet another embodiment to generate grayscale effects, PRBA XPCI masks can be stacked, i.e., multiple PRBA XPCI masks on top of one another. The stacked PRBA XPCI masks may be fabricated on physically independent substrates with unique patterns (in pixel size or based on an entirely different PRBS pattern). This embodiment would introduce greyscale randomness due to the unique patterns, as well as producing variations in total material thickness, resulting in a second, different type of greyscale randomness. For example, if four PRBA XPCI masks are stacked, any given pixel may have material on all four layers (resulting in the greatest absorption) or on none of the layers (maximum transmission), and on one, two, or three layers as in between absorption cases, i.e., the second type of greyscale randomness. This can be accomplished with each PRBA XPCI mask having the same pixel size or one PRBA XPCI mask could have pixels that are 2× greater on a side than another PRBA XPCI mask, and thus the mask with the smaller pixel size would have 4 pixels per single pixel of the larger mask. When multiple PRBA XPCI masks are stacked, this reduces potential fabrication issues as the features will likely have smaller aspect ratios due to the use of thinner layers of electrodeposited metal.

The various above described embodiments employing solder balls, electrodeposited features, etc., produce XPCI masks that primarily absorb x-rays. Thus, these XPCI masks are better suited, for example, to portable imaging systems employing broadband sources of high energy x-rays. Similar, though not identical, processes may be used to fabricate XPCI masks that primarily induce phase changes for use in systems employing monochromatic sources of low energy x-rays. As the goal with these monochromatic, low energy XPCI is a phase change, low density materials are better candidates for inducing the desired phase change while limiting absorption. Low density materials include, for example, cellulose acetate, silicon, or various polymers.

These low density, phase change materials may be placed on x-ray transparent substrates formed, for example, of silicon to form a phase change-based XPCI mask.

The PRBA XPCI mask offers certain advantages relative to some of the other XPCI masks. For example, the PRBA XPCI mask may be intentionally designed for a given application. This means, for example, that the PRBA XPCI mask can be designed for a specific energy as the energy the Transportation Security Agency (TSA) needs to penetrate a bag at the airport is different from the energy needed for a mammogram, which is different from the energy needed for a dental x-ray, etc. Another aspect is that the spatial resolution, or magnification, will differ from one application to another. For example, a TSA baggage x-ray system may have appreciable magnification as the item being imaged in a bag may be significantly closer to the x-ray source than the sensor. In contrast, a dental x-ray may have limited magnification as the tooth being imaged may be significantly closer to the sensor than the x-ray source. A PRBA mask can readily be optimized for these different applications by specifying the PRBA XPCI mask pixel size, the sub-window size, and the thickness of the metal deposited by the electrodeposition process, i.e., the pattern thickness. In contrast, and by way of example, the XPCI mask formed with a cold galvanizing compound spray paint does not allow one to specify an XPCI mask pixel size or a sub-window size (though the pattern thickness can be varied), making optimization of such a mask for a specific application far more difficult.

Correlation, in terms of an XPCI mask, relates to determining where a small piece of a measured x-ray projection image (a "chip") belongs in a reference x-ray projection of a mask. A perfect correlation gives the correct location of a measure chip in the reference x-ray projection. This process requires taking a chip and correlating it across a reference image of the mask, or a sufficiently contained localized region of the mask, to determine where the absorption features of the chip match those of the mask. It is difficult to ensure good XPCI correlation characteristics for a naturally random mask, for example, an XPCI mask formed with a cold galvanizing compound spray paint, there might be regions where the spray is too light or too heavy that contain little, if any, XPCI information. This leads to poor correlation, making reconstruction of the image difficult. In contrast, for a PRBA XPCI mask, since each sub-window of a defined size is known to be unique, and the layout of the sub-windows is controlled (i.e., pseudo-random), one will find the absorption matching pattern from that sub-window only once in the entire x-ray projection image of the mask. When an object is placed between the x-ray source and the x-ray sensor, it changes the image of the mask, as the image of the speckle pattern due to the XPCI mask is shifted and distorted. By comparing images with and without an object, i.e., by measuring the shifts and distortion, one can extract the data needed to reconstruct XPCI measures of just the object. See Berujon (2015), Berujon (2016), and Zdora (2018), cited above. With perfect correlation, one gets a perfect, unmistakable match, enabling reconstruction of the XPCI measures of the object being imaged. When there are multiple places in a localized neighborhood of the x-ray projection image (with the object) from the sensor that correlate with the reference x-ray projection, one cannot accurately reconstruct the XPCI measures of the object being imaged. As will be appreciated by one of skill, imaging noise will impact this process, resulting in less than perfect correlation even with a PRBA XPCI mask.

One additional advantage of the PRBA XPCI mask over the other XPCI mask embodiments is that the exact pattern of the PRBA XPCI mask is known. With this information, one can develop a more sensitive or robust image reconstruction algorithm. Further, since the image of the PRBA XPCI mask is known, one may be able to employ single shot imaging as a reference image, i.e., an image without the object, is not required. In this case, even with single shot imaging, one can again develop a more sensitive or robust image reconstruction algorithm based on the known reference image.

While the above description has focused on the use of x-rays as the illumination beam, i.e., XPCI, the invention may also be used with neutron phase contrast imaging (NPCI), though with a few modifications. The above described PRBA XPCI masks are for use with high energy x-rays, i.e., an illumination beam with x-rays having a mean energy of at least 30 keV. With NPCI, the minimum energy is far lower, with imaging using an illumination beam of even thermal neutrons having a mean energy of approximately 2.5 meV being possible, though use with neutron (or x-ray) energies of 1 MeV or greater should be possible. A silicon wafer may again be used as the illumination beam transparent substrate, but the composition of the illumination beam affecting pattern that absorbs or changes a phase of the neutron illumination beam is different. Specifically, the neutron beam affecting pattern may be formed, for example, of gadolinium, boron, samarium, or cadmium.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A phase contrast imaging (PCI) mask comprising:
an illumination beam transparent substrate adapted to transmit an illumination beam; and
an illumination beam affecting pattern formed on the illumination beam transparent substrate, the illumination beam affecting pattern including a plurality of mask sub-windows, each mask sub-window of the plurality of mask sub-windows including a unique two-dimensional (2D) pseudo-random binary array (PRBA), each 2D PRBA corresponding to a folded pseudo-random binary sequence (PRBS), each 2D PRBA including a 2D array of PRBA PCI mask pixels, and each PRBA PCI mask pixel being adapted to one of transmit, absorb, or change a phase of the illumination beam.

2. The PCI mask of claim 1, wherein the illumination beam transparent substrate includes one of silicon, borosilicate glass, aluminosilicate glass, or lithium-aluminosilicate glass-ceramic.

3. The PCI mask of claim 1,
wherein the illumination beam includes x-rays having a mean energy of at least 30 keV; and
wherein the illumination beam affecting pattern includes one or more of cobalt, copper, gold, iridium, lead, nickel, niobium, platinum, silver, tin-silver, tin, tungsten, or zinc.

4. The PCI mask of claim 1,
wherein the illumination beam includes x-rays having a mean energy of at least 30 keV; and wherein the illumination beam affecting pattern includes a seed layer, the seed layer including one or more of chrome, platinum, titanium, or titanium/gold.

5. The PCI mask of claim 4, wherein the illumination beam affecting pattern further includes a second layer, the second layer formed on the seed layer, the second layer including one or more of cobalt, copper, gold, iridium, lead, nickel, niobium, platinum, silver, tin-silver, tin, tungsten, or zinc.

6. The PCI mask of claim 1,
wherein the illumination beam includes neutrons having a mean energy of at least 2.5 meV; and
wherein the illumination beam affecting pattern includes one or more of boron, cadmium, gadolinium, or samarium.

7. The PCI mask of claim 1, wherein the illumination beam affecting pattern has a thickness between approximately 10 μm and approximately 60 μm.

8. The PCI mask of claim 1, wherein each pixel in each 2D array of PRBA PCI mask pixels has a size between approximately 10 μm and approximately 200 μm.

9. The PCI mask of claim 1,
wherein the plurality of mask sub-windows forms a mask window; and
wherein the mask window is tiled across the illumination beam transparent substrate.

10. A method for fabricating a phase contrast imaging (PCI) mask, the method comprising the steps of:
generating a pseudo-random binary sequence (PRBS);
folding the PRBS to create a pseudo-random binary array (PRBA);
specifying a pixel size and a mask size;
pixelating the PRBA based upon the specified pixel size;
converting the pixelated PRBA into a Graphic Design System stream format (GDS) file;
creating a photolithographic mask based upon the GDS file;
preparing a PCI mask substrate; and
transferring a pattern on the photolithographic mask to the PCI mask substrate.

11. The method of claim 10, wherein the pixel size is between approximately 10 μm and approximately 200 μm.

12. The method of claim 10, wherein the step of converting the pixelated PRBA includes the step of tiling the pixelated PRBA based upon the specified mask size.

13. The method of claim 10, wherein the step of preparing the PCI substrate includes depositing a layer on the PCI mask substrate, the layer including one or more of boron, cadmium, chrome, cobalt, copper, gadolinium, gold, iridium, lead, nickel, niobium, platinum, samarium, silver, tin-silver, tin, titanium, tungsten, or zinc.

14. The method of claim 10,
wherein the step of preparing the PCI substrate includes depositing a seed layer, the seed layer including one or more of chrome, platinum, titanium, or titanium/gold; and
wherein the step of transferring a pattern includes electrodepositing a layer of one or more of cobalt, copper, gold, iridium, lead, nickel, niobium, platinum, silver, tin-silver, tin, tungsten, or zinc on a portion of the seed layer.

15. The method of claim 1, wherein the PCI mask substrate includes one of silicon, borosilicate glass, aluminosilicate glass, or lithium-aluminosilicate glass-ceramic.

16. An x-ray phase contrast imaging (XPCI) mask comprising:
an x-ray transparent substrate adapted to transmit an x-ray beam, wherein x-rays in the x-ray beam have a mean energy of at least 30 keV; and
an x-ray affecting pattern formed on the x-ray transparent substrate, the x-ray affecting pattern including a plurality of mask sub-windows, each mask sub-window of the plurality of mask sub-windows including:
a two-dimensional (2D) array of first features, each of the first features being a solder wettable metal pad including one or more of copper, gold, nickel, platinum, or titanium; and
a respective second feature formed on each of the first features, each of the first features and respective second features adapted to absorb or change a phase of the x-ray beam, each of the second features being a reflowed solder cap including one or more of antimony, bismuth, copper, indium, lead, silver, tin, or zinc.

17. The XPCI mask of claim 16, wherein the x-ray transparent substrate includes silicon, borosilicate glass, aluminosilicate glass, or lithium-aluminosilicate glass-ceramic.

18. The XPCI mask of claim 16,
wherein each of the first features is a seed layer including one or more of chrome, platinum, titanium, or titanium/gold; and
wherein each of the second features is an x-ray absorbing layer including one or more of cobalt, copper, gold, iridium, lead, nickel, niobium, platinum, silver, tin-silver, tin, tungsten, or zinc.

19. The XPCI mask of claim 16,
wherein the plurality of mask sub-windows forms a mask window; and
wherein the mask window is tiled across the x-ray transparent substrate.

* * * * *